(12) United States Patent
Song et al.

(10) Patent No.: US 10,614,146 B2
(45) Date of Patent: Apr. 7, 2020

(54) ADAPTIVE DEMAND RESPONSE METHOD USING BATTERIES WITH COMMERCIAL BUILDINGS FOR GRID STABILITY AND SUSTAINABLE GROWTH

(71) Applicant: Siemens Aktiengesellschaft, Munich (DE)

(72) Inventors: Zhen Song, Plainsboro, NJ (US); Sanjeev Srivastava, Princeton, NJ (US); Yubo Wang, Pasadena, CA (US)

(73) Assignee: Siemens Aktiengesellschaft, Munich (DE)

( * ) Notice: Subject to any disclaimer, the term of this patent is extended or adjusted under 35 U.S.C. 154(b) by 499 days.

(21) Appl. No.: 15/383,308

(22) Filed: Dec. 19, 2016

(65) Prior Publication Data

US 2017/0177766 A1 Jun. 22, 2017

Related U.S. Application Data

(60) Provisional application No. 62/268,733, filed on Dec. 17, 2015.

(51) Int. Cl.
*G06F 17/50* (2006.01)
*G06F 17/11* (2006.01)
(Continued)

(52) U.S. Cl.
CPC ............. *G06F 17/11* (2013.01); *G05B 15/02* (2013.01); *H02J 3/00* (2013.01); *H02J 3/14* (2013.01); *H02J 3/32* (2013.01); *H02J 7/0021* (2013.01); *H02J 7/0029* (2013.01); *H02J 7/0047* (2013.01); *H02J 7/0057* (2013.01);

*B60L 3/0046* (2013.01); *B60L 58/12* (2019.02); *B60L 58/16* (2019.02); *G01R 31/36* (2013.01); *G01R 31/392* (2019.01); *G05B 2219/2642* (2013.01); *H02J 2003/003* (2013.01); *H02J 2003/007* (2013.01); *H02J 2003/146* (2013.01);
(Continued)

(58) Field of Classification Search
None
See application file for complete search history.

(56) References Cited

U.S. PATENT DOCUMENTS

| 6,771,044 B1 * | 8/2004 | Vinciguerra | H02J 9/061 320/116 |
| 8,310,851 B2 * | 11/2012 | Cesnak | H02M 7/48 363/95 |

(Continued)

*Primary Examiner* — Kibrom K Gebresilassie

(57) ABSTRACT

A system for calculating total lifecycle costs for a building energy management system includes lifecycle costs for a grid-scale battery system. The system includes a battery lifecycle optimizer configured to provide an optimal battery configuration for a building and a building energy system controller. The building energy system controller receives optimum battery configuration information, information relating to the heat ventilation air conditioning system of the building, intrinsic thermodynamic properties of the building, energy tariff schedules and weather forecast data to forecast a monthly peak demand profile. A simulation is run using a battery model, system model along with tariff and weather information to produce an hourly building energy management plan for minimizing overall energy costs with consideration of system lifecycle costs.

18 Claims, 8 Drawing Sheets

US 10,614,146 B2

Page 2

(51) Int. Cl.
- *H02J 7/00* (2006.01)
- *H02J 3/00* (2006.01)
- *H02J 3/14* (2006.01)
- *H02J 3/32* (2006.01)
- *G05B 15/02* (2006.01)
- *B60L 3/00* (2019.01)
- *B60L 58/12* (2019.01)
- *B60L 58/16* (2019.01)
- *G01R 31/392* (2019.01)
- *G01R 31/36* (2020.01)

(52) U.S. Cl.
CPC .......... *Y02E 10/563* (2013.01); *Y02E 10/566* (2013.01); *Y02E 10/766* (2013.01)

(56) References Cited

U.S. PATENT DOCUMENTS

| | | | | |
|---|---|---|---|---|
| 8,370,283 | B2* | 2/2013 | Pitcher | G06F 17/5009 703/2 |
| 9,159,108 | B2* | 10/2015 | Steven | G06Q 10/06 |
| 9,335,747 | B2* | 5/2016 | Steven | G06Q 10/00 |
| 9,336,338 | B2* | 5/2016 | Legbedji | G06Q 50/06 |
| 9,448,550 | B2* | 9/2016 | Ha | G05B 19/042 |
| 10,181,896 | B1* | 1/2019 | Swift | H04W 52/0216 |
| 2010/0179704 | A1* | 7/2010 | Ozog | G06Q 10/06315 700/291 |
| 2012/0065793 | A1* | 3/2012 | Kaji | H02J 3/14 700/291 |
| 2013/0013121 | A1* | 1/2013 | Henze | G06Q 10/04 700/291 |
| 2013/0214730 | A1* | 8/2013 | Lu | H02J 7/007 320/107 |
| 2013/0334880 | A1* | 12/2013 | Jerphagnon | H02J 4/00 307/23 |
| 2013/0338845 | A1* | 12/2013 | Jerphagnon | H02J 4/00 700/297 |
| 2014/0039965 | A1* | 2/2014 | Steven | G06Q 10/06315 705/7.25 |
| 2014/0097758 | A1* | 4/2014 | Recker | H05B 37/0272 315/152 |
| 2014/0156335 | A1* | 6/2014 | Hanson | G06Q 10/06315 705/7.25 |
| 2014/0257526 | A1* | 9/2014 | Tiwari | G05B 13/02 700/29 |
| 2014/0257884 | A1* | 9/2014 | Kyoung | G06Q 10/02 705/5 |
| 2014/0304025 | A1* | 10/2014 | Steven | G06Q 10/06314 705/7.24 |
| 2015/0019034 | A1* | 1/2015 | Gonatas | H01L 31/02021 700/291 |
| 2015/0207316 | A1* | 7/2015 | Saussele | H02S 10/20 700/287 |
| 2015/0268307 | A1* | 9/2015 | Inguva | B60L 58/16 702/63 |
| 2016/0006253 | A1* | 1/2016 | Saussele | H02S 10/20 307/24 |
| 2016/0114698 | A1* | 4/2016 | Chow | B60L 58/12 701/22 |
| 2016/0305678 | A1* | 10/2016 | Pavlovski | G05B 13/048 |
| 2017/0256004 | A1* | 9/2017 | Hooshmand | G05B 15/02 |
| 2018/0254632 | A1* | 9/2018 | Elbsat | H02J 3/00 |
| 2019/0305384 | A1* | 10/2019 | Liu | G01R 31/02 |
| 2019/0329669 | A1* | 10/2019 | Soeda | G06Q 20/29 |

* cited by examiner

| costName | months | days | hours | cost |
|---|---|---|---|---|
| 'DDC_8to6_Summer' | [6,7,8,9] | [2,3,4,5,6] | 1x11 double | 8.1700 |
| 'DDC_8to10_Summer' | [6,7,8,9] | [2,3,4,5,6] | 1x15 double | 17.5100 |
| 'DDC_All_Summer' | [6,7,8,9] | [1,2,3,4,5,6,7] | 1x24 double | 16.7500 |
| 'DDC_8to6_nonSummer' | [1,2,3,4,5,6,7,8,9,10,11,12] | [2,3,4,5,6] | 1x15 double | 11.3400 |
| 'DDC_All_nonSummer' | [1,2,3,4,5,6,7,8,9,10,11,12] | [1,2,3,4,5,6,7] | 1x24 double | 4.8000 |
| 'DSC_8to10_nonSummer' | [1,2,3,4,5,6,7,8,9,10,11,12] | [2,3,4,5,6] | 1x15 double | 14.8800 |

| | Building Type | Battery Size | Inverter Size | Upper Bound | Lower Bound | Payback Time | Battery Salvage Value (> 2yrs) |
|---|---|---|---|---|---|---|---|
| 601 | Large Hotel | 10 kWh | 10 kWh | 2144, 317 | 1874, 243 | [1.4  1.6] | [0.78 0.83] |
| 603 | Medium Office | 5 kWh | 5 kWh | 939, 118 | 828, 78 | [1.6  1.8] | [0.84 0.90] |
| 605 | Small Office | 1 kWh | 1 kWh | 104, 12 | 95, 12 | [2.9  3.2] | [0.92] |

ADAPTIVE DEMAND RESPONSE METHOD USING BATTERIES WITH COMMERCIAL BUILDINGS FOR GRID STABILITY AND SUSTAINABLE GROWTH

CROSS-REFERENCE TO RELATED APPLICATIONS

This application claims priority under 35 U.S.C. 119(e) to U.S. Provisional Patent Application Ser. No. 62/268,733 filed Dec. 17, 2015, entitled ADAPTIVE DEMAND RESPONSE METHOD USING BATTERIES WITH COMMERCIAL BUILDINGS FOR GRID STABILITY AND SUSTAINABLE GROWTH, the entire contents of which are incorporated by reference herein in their entirety.

TECHNICAL FIELD

Aspects of this disclosure relate to power distribution. More particularly, aspects of this disclosure relate to smart grids.

BACKGROUND

Energy demands are growing, particularly in urban areas. In addition, demand levels fluctuate throughout the day, with peak demand periods placing considerable demands on utility companies and the power supply grid. Adding to the challenge of meeting increasing demand, environmental considerations have increased the use of alternative energy sources, to power the grid. For example, wind turbines and solar photo-voltaic (PV) panels are becoming more popular as alternative power services. While these alternative energy sources provide additional electrical power sources and further provide environmental benefits, they are also subject to environmental or weather events. For example, weather events, such as cloud cover occluding solar energy, or severe wind conditions or lack of wind conditions, may cause alternative energy sources such as these to temporarily and periodically negatively affect the ability of these sources to generate power.

To address these time-varying power supply levels in concert with varying demand, solutions must be developed to provide a stable power supply. One solution includes the use of grid-scale batteries to serve as a reserve power source. Batteries store energy and may provide electrical power when either power demand increases, for example in a commercial building, or if power sources supplying the power grid are negatively affected by factors such as various weather related events. However, until now, battery systems have not been integrated with Building Automation Systems (BAS) and Building Management Systems (BMS), preventing the ability to optimize these solutions for sustainability and stability.

Forecasting demand response (DR) may provide some ability to manage demand through load shifting. But current solutions only provide short-term forecasts of one or two days. These solutions cannot exploit tariff schedules provided by utility companies that span timelines of about one month or more.

Improved solutions are desired to address these disadvantages.

SUMMARY

A system for calculating total lifecycle costs for a building energy management system includes lifecycle costs for a grid-scale battery system. The system includes a battery lifecycle optimizer configured to provide an optimal battery configuration for a building and a building energy system controller. The building energy system controller receives optimum battery configuration information, information relating to the heat ventilation air conditioning system of the building, intrinsic thermodynamic properties of the building, energy tariff schedules and weather forecast data to forecast a monthly peak demand profile. A simulation is run using a battery model, system model along with tariff and weather information to produce an hourly building energy management plan for minimizing overall energy costs with consideration of system lifecycle costs.

According to aspects of the disclosure, a system for calculating lifecycle costs for a battery based energy storage (ES) system includes a battery lifecycle optimizer, a peak power demand forecaster, configured to identify a number, n, of top peak demands within a time period spanning about one month and a building energy system controller configured to perform a simulation of a building energy plan, the building energy plan comprising an hourly energy management plan for utilizing at least one of a battery energy storage system, a building heat, ventilation, and air conditioning (HVAC) system, and a building thermal properties profile. The building energy system controller is configured to identify an optimal hourly energy program, the optimal hourly energy plan representative of a minimized energy cost for the building.

According to aspects of the disclosure the battery lifecycle optimizer is configured to receive a plurality of battery models, each battery model configured, when used by the battery lifecycle optimizer, to simulate one of a plurality of battery configurations.

According to aspects of the disclosure, the building energy controller is configured to receive a building thermal properties profile representative of thermodynamic characteristics of the building.

According to aspects of the disclosure, the building energy controller is further configured to receive at least one of a plurality of tariff schedules representative of time variant energy costs for a given energy provider.

According to other aspects of the disclosure, the building energy controller is further configured to receive at least one of a plurality of tariff schedules representative of time variant energy costs for a given energy provider.

According to other aspects of the disclosure, the building energy controller is configured to output the optimal hourly energy program in a format receivable by at least one of a building automation system (BAS) and a building management system (BMS).

In other aspects of the disclosure, the building energy controller is configured as a model predictive control (MPC) configured to run a battery lifecycle simulation based on a plurality of static configuration parameters.

According to aspects of other embodiments of the disclosure, the plurality of static configuration parameters includes at least one of:
  battery capacity;
  inverter size;
  threshold values to trigger battery charging or discharging; and
  a vector containing internal states of a building or a battery.
  the vector containing internal states of the building or battery may include at least one of building zone temperature measurements; building zone humidity measurements; remote terminal unit (RTU) static pressure values; supply air temperature values; return duct $CO_2$ level values; outdoor temperature values; and outdoor relative humidity values.

A method for optimizing lifecycle costs of a battery based energy storage (ES) system according to aspects of the disclosure includes in a battery lifecycle optimization processor, calculating an optimal battery configuration including an optimized size for the battery, the battery configured to provide supplemental power to a building, the building connected to a power grid, calculating a monthly peak power requirement for the building; and calculating a hourly energy management plan based on the monthly peak power requirement and the optimized battery configuration.

According to aspects of the disclosure, calculating an optimal battery configuration comprises receiving at least one of a plurality of battery models, each battery model including information representative of a battery size, capacity and costs related to the battery's degree of discharge.

According to aspects of the disclosure, calculating a monthly peak power requirement for the building comprises forecasting a number, n, of the highest peak power demand days within a given month.

According to aspects of the disclosure, the number of highest peak power demand days is five.

According to aspects of the disclosure, calculating the optimal battery configuration comprises minimizing a combined factor representative of battery degradation cost relating to the state of health of the battery, energy cost, and demand power cost with respect to a vector of the operating power of the battery.

According to aspects of the disclosure, calculating the optimal battery configuration is achieved using a convex optimization technique.

According to aspects of the disclosure, calculating the monthly peak power requirement includes receiving a short-term weather forecast and historical weather data; receiving historical peak load information for the building; inputting the short-term weather forecast, historical weather data and historical peak load information to an artificial neural network configured to produce a predicted load profile.

According to aspects of the disclosure, calculating the monthly power requirement includes fusing data sources using a weighted calculation wherein the weighted calculation is one of a weighted least squares (WLS) calculation, and a Recursive Weighted Least Squares (RWLS) calculation.

According to aspects of the disclosure, the data sources may include a historical load predictor output; a run-time load predictor output; and/or a run-time weather predictor output.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION

Figure 1:
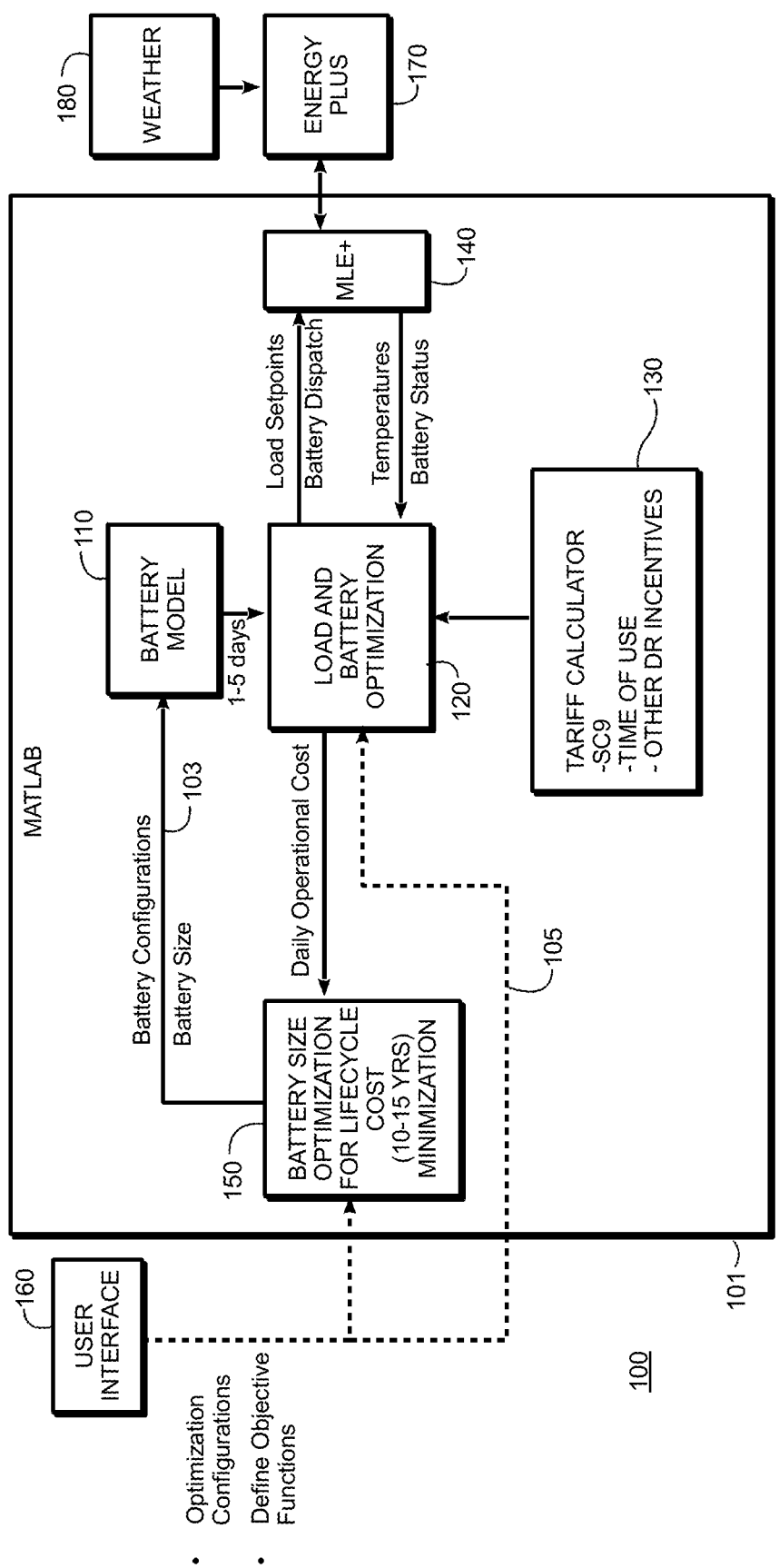
FIG. 1 is block diagram of a battery lifecycle optimization system according to aspects of an embodiment of this disclosure.

There are two driving factors to integrate grid-scale batteries to commercial buildings, to guarantee grid stability and sustainable growth.

One reason is due to the stringent energy supply. In urban areas peak demand continues to rise. Yet peak demand is only reached for few hours per year. In New York City, for example, the peak load can reach up to 13 Gigawatts (GW), while staying about or below 10 GW for most of the year. ConEdison, the New York City electrical utility, therefore has to maintain a network in the presence of growing peak demand that is utilized only for a few hours and only on a few days. Distribution network upgrades are therefore required to increase the system level peak power capacity.

Another factor driving the integration of batteries to buildings is the growing adoption of intermittent renewable energy sources, such as solar photo-voltaic (PV) panels and wind turbines. Despite the positive environmental impacts, the intermittent energy sources may compromise the grid stability, due to the time-varying weather conditions.

In order to regulate electricity demand, utility companies provide incentives via different demand response (DR) programs. In DR events, peak demand curtailments are typically encouraged by financial incentives from the utilities. On the other hand, too much peak demand by a customer during certain times may result in financial penalty. The structure of the energy pricing policy is referred as a tariff model. In this invention, the terms "tariff" and DR are interchangeable.

In many tariff models, the peak load of the month has a significant impact to a customer's energy bill. For example, with reference to the SC9 tariff model used in New York City, if a building's peak load is higher than a given threshold for merely one hour per month, the building owner may have to pay significant tariff premiums, which may contribute significant additional amounts to the utility bill. In a simplified example, an energy bill calculation would include a charge of $50 per kWh at the peak of the month, plus a charge of about $0.2 kWh for the total energy consumption for the month. In aspects of the present invention, these monthly energy bills may be reduced by forecasting monthly demand cycles, and leveraging battery-based energy storage (ES) solutions, heating, ventilation, air conditioning (HVAC), and combinations thereof to minimize life cycle costs of these systems. To this end, the challenges of optimal design and model predictive control (MPC) for optimal battery to building integrated control are directed.

For given configurations of a particular building, optimal design allows for the selection of battery and inverter sizes in order to maximize the return on investment (ROI) and minimize life cycle costs.

Under these conditions, energy storage (ES) within commercial buildings is an emerging disruptive technology to ensure grid stability and sustainable growth, especially in some large cities, such as New York City.

Aspects of this disclosure address at least the following challenges:
1. Optimal Design: Given configurations of a particularly building, find the proper size of the battery system, in order to maximize the return on investment (ROI), or minimize the life cycle costs.
2. Model Prediction Control (MPC) for building integrated optimal battery system: Commercial buildings have intrinsic thermal energy storage capabilities, via pre-heating or pre-cooling actions. Batteries are expensive electricity energy storage devices. It is desirable to avoid frequent charging and discharging, which may deteriorate battery performance. In order to control costs, it is natural to integrate the battery and building systems together within one optimal control framework, such as MPC.

Prior solutions attempt to provide similar features. There are generally two types of conventional systems that offer alternative solutions:
1. Separated Battery and Building Control: For example, the Tesla Power Wall is a packaged battery with management system inside. Accordingly, it is not integrated with (BAS).
2. Stand-alone energy storage (ES) Assessment Software: U.S. Department of Energy (DOE) distributed energy resources-customer adoption model (DER-CAM) is a software platform for micro-grid designers. Users may specify the building and battery types. The software will then compute optimal configurations, such as battery size, inverter type, solar panel settings, etc. But, the software is not flexible enough to extend to different tariff models, such as the SC9 model in New York City. Furthermore, the software does not support detailed simulation of a Building Automation System/Building Management System and does cannot generate the optimal battery control policies within this environment.

This disclosure provides in one aspect, a high fidelity simulation platform that can generate battery control policies. The tariff model in the invention is extensible, so that users can assess the life cycle costs at different geographical locations.

Within the perspective of a commercial building, the coordinated activity of batteries and building automation systems may be simulated to provide a modeling and optimization methodology. Modeling of building controllable loads (e.g., fans, air vents, chiller set points, pre-cooling temperatures) is necessary to simulate the coordinated activity of batteries and building automation systems. To simulate building operations, according to certain aspects of this disclosure, a software package may be used. For example, certain aspects of the disclosure may be implemented with the assistance of EnergyPlus, a building energy simulation platform developed by the U.S. Department of Energy (DOE). While the case described below uses EnergyPlus, there are many building energy simulation solutions which may be used. For example, other building energy simulation programs such as TRNSYS, DOE2, BCVTB and like may also be used. The applications and methodologies described herein may be implemented in any building energy simulation software. These methodologies provide novel implementations for Building energy systems and are independent of the building energy simulation software used to carry them out. When the implemented novel methodologies are implemented it is these methods that are part of an improved building energy system allowing efficiencies not previously achievable. EnergyPlus is widely used to simulate building operations for specific buildings, described in corresponding IDF configuration files that are representative of the building details, including window locations to temperature set points. Tariff calculators may be implemented to account for present and future tariffs or demand response (DR) programs. A simulation may also be developed to provide a complete model of rechargeable batteries. The simulation components may be combined to provide a complete picture of a commercial building with supplemental battery power within the context of a given smart grid environment. The simulation components may be combined using available tools appropriate for receiving the different modeling outputs and providing sufficient computing power to run a simulation of the entire system. For example, MATLAB provides a tool for managing simulation components of aspects of the present disclosure given MATLAB's flexibility and computation power.

Developed by the DOE, EnergyPlus is widely considered an ad hoc standard for building energy simulation platforms. EnergyPlus provides advantageous features which may be used to develop simulations according to certain aspects of this disclosure. However, additional or alternative simulation tools may be used without departing from the scope and spirit of this disclosure. One advantage of EnergyPlus is that it was designed for long term building energy simulation. Typical use cases may be monthly or annual energy bill simulations. DOE has invested significant resources to ensure simulations are fast and accurate.

EnergyPlus users may focus on energy policies and ignore various levels of detail. Standard commercial buildings have supervisory control and field device control. The sampling time of the field devices are often at a sub-second level and simple feedback loops are generally implemented as a variation of a Proportional-Integral-Derivative (PID) control loop. For example, in typical Variable Air Volume (VAV) box controls, 2 or 3 configurable PID controllers may be combined to provide closed-loop control on local actuators, including dampers, cooling coils, and heating coils. It is tremendous effort to configure the detailed parameters of the field device control logic. EnergyPlus users may instead focus on energy policies in the supervisory control level, i.e., the control logic in the Building Automation Systems. In coordination with control, EnergyPlus users may focus on the supervisory control logic.

EnergyPlus provides flexibility to coordinate separate building models and weather files to simulate the operation of a building under different settings. For example, the EnergyPlus website (http://energyplus.net/weather) allows users to download standard weather files that may be directly imported and used by the EnergyPlus platform. The available weather files include weather information for multiple sites in and around New York City, by way of example. In addition, the DOE Building Energy Code website (http://www.energycodes.gov) allows users to download a variety of building models and weather files.

Some aspects of the present invention may be achieved on a simulation platform based in MATLAB. FIG. 1 is a block diagram of an exemplary system architecture 100 built on MATLAB.

The system of FIG. 1 provides a simulation model that exploits two loops of optimization. A first outer loop, denoted by the dashed line 105, optimizes battery size considering life cycle costs (e.g., battery and building operations). A second inner loop, denoted by the solid line 103, provides a real-time run optimization, considering battery dispatch and load control for daily operation cost optimization, based on battery model 110. The lifecycle cost minimization block 150 simulates 10 to 15 years of the simulated time. The lifecycle cost minimization performs an optimization calculation which is configured to minimize overall lifecycle costs. Accordingly, a specialized battery lifecycle optimization processor provided with executable instructions to operate to solve the problem of minimizing lifecycle costs of operating an energy storage system, such as a battery system. The battery lifecycle optimization processor may be configured to receive information relating to the size and configuration of the battery, data representative of the thermodynamic characteristics of a building, weather data, tariff information, data representative of an HVAC system of the building, and information relating to costs attributable to charging and discharging cycles of the battery. The Load and Battery Optimization 120 block simulates the onsite controller, which interoperates with battery management system (BMS), building automation system (BAS) in each simulation step. This Load and Battery Optimization 120 considers battery model, tariff, and potential weather and occupancy information, depicted in block 130, in order to generate the optimal set points for the MBS and BAS.

The co-simulation function (MLE+) 140 is necessary for carrying out the overall simulation. Although EnergyPlus 170 provides high fidelity building energy simulation capabilities, it is not extensible for accurate battery life cycle simulations. In addition to EnergyPlus, other building energy simulation programs such as TRNSYS, DOE2, BCVTB and like may also be used. Each building energy simulation software solution may be integrated with functionality from Matlab to provide a co-simulation function, which is referenced generally in this disclosure as MLE+. As these simulation solutions are not extensible, these calculations are performed by the battery lifecycle optimization processor, which has been implemented at least in part with instructions generated in Matlab 101. Additionally, Matlab 101 provides numerous toolboxes for algorithm development, thereby providing additional executable instructions which may be utilized by the battery lifecycle optimization processor. EnergyPlus 170 does not have these features, because it is not designed for advance control. The field-level control of EnergyPlus 170 is fixed. The supervisory control in EnergyPlus 170 is configured by parameters or simple "if-then" types of logic.

Figure 2:
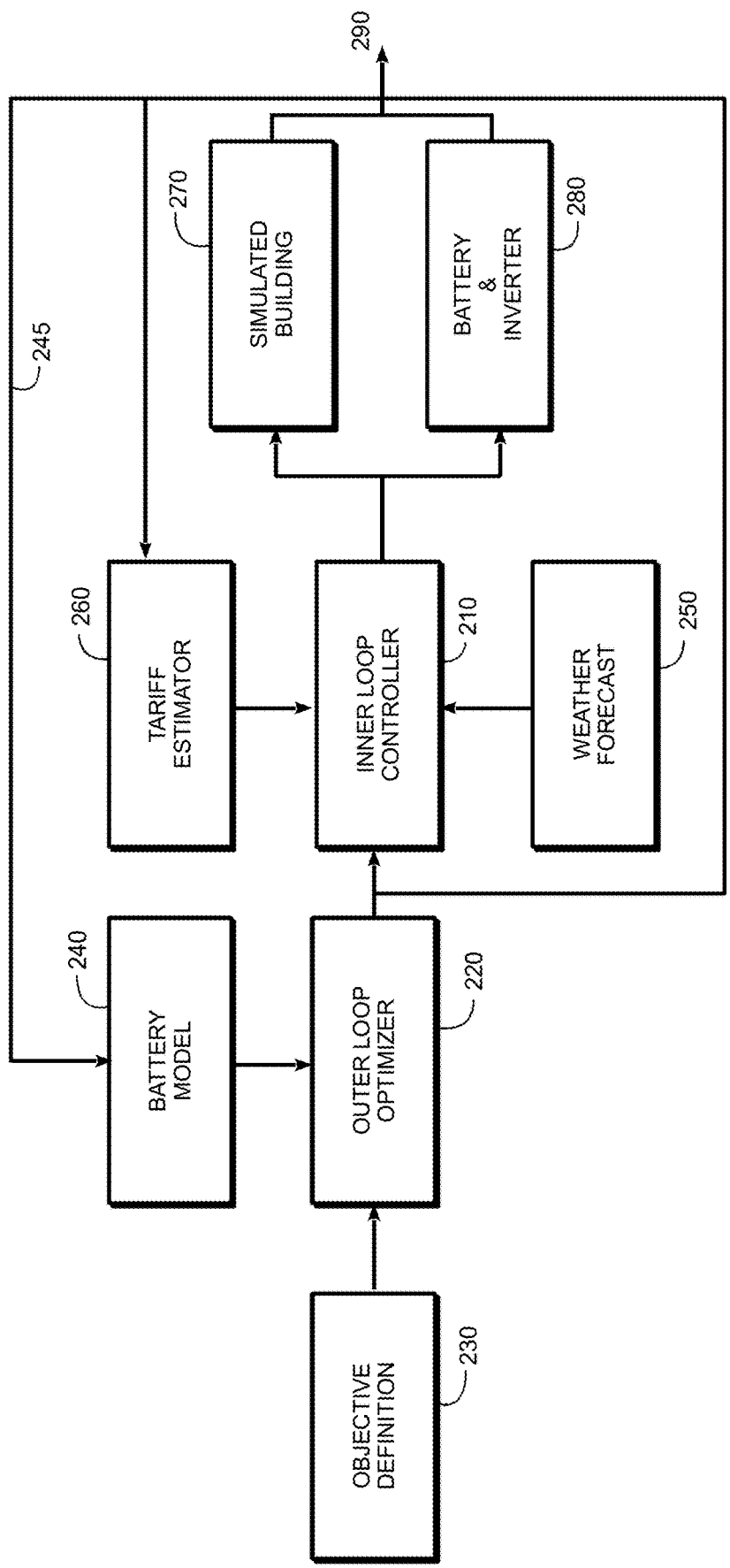
FIG. 2 is a block diagram of the battery lifecycle optimization system of FIG. 1 illustrating a data flow in the dual loop system of the lifecycle optimization system.

Referring now to FIG. 2, a flow chart depicting a dual-loop battery to building lifecycle simulation (DLS) platform is shown. FIG. 2 illustrates an information flow of the simulation platform. Each block represents a corresponding simulation component in the DLS platform. The DLS includes two loops as shown in FIG. 2.

The inner loop controller 210 operates to implement integrated battery and building control. In hardware systems, the inner loop controller 210 updates BAS and battery set points in order to minimize both the short term tariff (costs) 260 and long term life cycle costs (e.g. battery degradation). There are trade-offs between these two considerations. On one hand, frequent charge and/or discharge of the batteries may shift the building peak load and reduce the tariff, but battery health conditions or state of health (SoH) may degrade too rapidly, thereby adding to the lifecycle costs. For example, the user may be required to replace expensive batteries prematurely. On the other hand, if the battery usage control is too conservative, this may provide longer battery life, but may lead to higher tariff, which also reduces overall ROI. An ideal inner loop controller 210 considers available information, including for example, weather 250, occupancy, building thermal models and the like (e.g. building model) 270 to minimize aggregate costs, including both short-term cost such as tariffs 260 and long-term costs such as lifecycle costs including battery usage and degradation (e.g. battery model) 240.

Referring again to FIG. 2, the operation of the dual loop system will be described. An objective is defined 230 which characterizes the system properties are sought to be optimized. For example, an overall lifecycle cost may be optimized by taking into consideration energy storage solutions such as batteries, along with building thermal properties, including HVAC systems within the building and intrinsic thermal properties of the building, weather forecasts, peak usage forecasts, and tariff and demand response incentives. The objective definition 230 provides parameters to the outer loop optimizer 220. The outer loop optimizer 220 also receives information relating to a battery through battery model 240. The battery model is determined based in part of the operation of the inner loop controller 210. Based on the properties represented in the battery model 240, and the defined objective 230, the outer loop optimizer 220 includes a battery lifecycle controller which executes computer instructions to produce an optimal battery configuration meeting the requirements for energy demand in the building while minimizing overall energy costs when considered along with other system lifecycle costs.

The optimal battery configuration is provided to inner loop controller 210. Inner loop controller 210 further receives weather forecast information 250, as well as tariff costs or demand response incentives from tariff estimator 260. The inner loop controller 210 further includes information relating to the building configuration including information relating to the HVAC system in the building, long-term (e.g. monthly) forecasts of building energy demand, and intrinsic thermal properties of the building. Intrinsic thermal properties may include the duration for which the building retains heat or cooling based on pre-heating of pre-cooling. For example, during summer hours, the building may operate the air conditioning system to cool the air in the building to reduce temperatures. Cooling of the building may be aided dependent on the time of day. For example, it requires less energy to pre-cool the building during nighttime hours than during the day because thermal energy from the sun is reduced. When the building reaches a desired temperature, the building is said to be pre-cooled. If the HVAC system is powered off, various physical features of the building, including structural materials (e.g. glass versus stone), the number of windows, the attitude of the building relative to the path of the sun, among other features, will determine how long the building will remain at a comfortable temperature. During warm weather, the heat from the surrounding environment, including solar thermal energy will begin to heat the building to a point where a set point or threshold is reached and the HVAC system must be powered on to reduce the temperature. In a building with many windows, the solar energy is more easily transferred to the interior of the building through conduction and radiation. Meanwhile other materials, such as stone, retain the cooler temperatures of the pre-cooled building and do not transmit of allow radiation to pass through them, thereby allowing the building to remain cooler for a longer period of time.

The inner loop controller 210 uses the received information including battery size and configuration, weather information 250 and tariff schedules 260 to create a simulation including a simulated building 270 and a theoretical battery and inverter model 280. The inner loop controller 210 may further be configured to operate a simulation between the simulated building 270 and the model battery and inverter 280 to output an optimal battery supplemented energy usage plan 290 that may be provided to a BAS for providing commands for building automation and control.

Similarly, information provided by the inner loop controller 210 may provide feedback 245 to outer loop optimizer 220 via an updated battery model 240. This provides updated input information to the outer loop optimizer 220 to further enable the outer loop optimizer to specify an updated optimum battery size or configuration which is further provided to inner loop controller 210 to update the model information for future simulations.

A generic inner loop controller may be implemented as a Model Predictive Control (MPC) to minimize an objective function, $J_1[n]$, at each time instance. MPC is a class of optimal controllers having many variations, (e.g., linear quadratic MPC, nonlinear MPC, etc.). A generic depiction of a MPC is illustrated in FIG. 2, where the objective 230 is to minimize the difference between the future reference trajectory and the predicted output. Assuming the desire is optimization of results as M future time steps, the formulation of a generic MPC is according to:

$$\min J_1[n] := \Sigma_{i=0}^{M} f_1(X[n-i];\theta) \quad \text{Equation (1)}$$

subject to:

$$g_1(X[n];\theta)=0,$$

$$g_2(X[n];\theta) \leq 0$$

$$X[n+1]=g_3(X[n];\theta). \quad \text{Equation (2)}$$

where $\theta$ is the static configuration parameters, such as battery capacity $\theta_B$, inverter size $\theta_I$, and threshold parameters for the inner loop controller $\theta_{Th}$. The current candidate $\theta_{Th}$ is the thresholds load to trigger battery charging and discharging events. Different $\theta_{Th}$ may be explored during the inner loop design process. The following definition:

$$\theta=[\theta_B,\theta_I,\theta_{Th}]^T \quad \text{Equation (3)}$$

These parameters may be updated after each iteration of a battery life cycle simulation and do not change within each sampling time period. For example, in terms of simulated time, the inner loop control 210 updates the set points every 15 minutes with fixed $\theta$. For each iteration, the outer loop controller 220 needs to run many iterations with different $\theta$. The vector X[n] is the internal states of the building and the battery. Candidate states may be represented by the following:

1. Zone Temperature Measurement: $T[n]=[T_1[n], T_2[n], \ldots, T_{Nz}[n]]^T$ The number $N_Z$ is the number of thermal zones.
2. Zone Humidity Measurement: $H[n]=[H_1[n],H_2[n], \ldots, H_{Nz}[n]]^T$.
3. RTU static pressure: $P^S[n]=[P^S_1[n], P^S_2[n], \ldots, P^S_{NRTU}[n]]^T$, where $N_{RTU}$ is the number of RTUs in the building.
4. Supply Air Temperature: $T^{SA}[n]=[T^{SA}_1[n], T^{SA}_2[n], \ldots, T^{SA}_{NRTU}[n]]^T$.
5. Return duct $CO_2$ level: $S^{CO2}[n]$.
6. Outdoor temperature and relative humidity: $T^{OA}[n]$ and $R^{OA}[n]$.

The candidate state variable is a vector that stacks the aforementioned vectors together according to:

$$x[n]=[T^{OA}[n];R^{OA}[n];T[n];H[n];P^S[n]T^{SA}[n];S^{CO2}[n]], \quad \text{Equation (4)}$$

where ";" means that the vectors are aligned column-wise.

An equality constraint function, $g_1$, can be used to capture requirements on schedule, set points, etc. The inequality constraint function $g_2$ may be applied to comfort and tariff, etc. The building and battery dynamics are captured in the function $g_3$, i.e. EnergyPlus model). For linear systems, the function may be simplified to state space or transfer function models. An example state space model is given by:

$$X[n+1]=AX[n]+Bu[n] \quad \text{Equation (5)}$$

where A, B are matrices identified by System Identification algorithms. The variable u[n] is the input vector, including the following candidate set points 1. Zone temperature measurement: $T[n]=[T_1[n], T_2[n], \ldots, T_{NZ}[n]]^T$. The number $N_Z$ is the number of thermal zones.
2. Zone humidity measurement: $H[n]=[H_1[n], H_2[n], \ldots, H_{(NZ)}[n]]^T$.
3. RTU static pressure: $P^S[n]=[P^S_1[n], P^S_2[n], \ldots, P^S_{NRTU}[n]]^T$, where $N_{RTU}$ is the number of RTUs in the building.
4. Supply air temperature: $T^{SA}[n]=[T^{SA}_1[n], T^{SA}_2[n], \ldots, T^{SA}_{NRTU}[n]]^T$.
5. Return duct CO2 level: $S^{CO2}[n]$.
6. Outdoor temperature and relative humidity: $T^{OA}[n]$ and $R^{OA}[n]$.

The candidate state variable is a vector that stacks the aforementioned vectors together:
$X[n]=[T^{OA}[n]; R^{OA}[n]; T[n]; H[n]; P^S[n]; T^{SA}[n]; S^{CO2}[n]]$, where;" means that the vectors are aligned column-wise.

The equality constraint function g_1 can be used to capture requirements on schedule, set points etc.; The inequality constraint function g_2 may be applied to comfort and tariff, etc.; The building and battery dynamics are captured in the function g_3, i.e., EnergyPlus model. For linear systems, we can simplify the function to state space or transfer function models. The example state space model is as the following format:

$$X[n+1]=AX[n]+Bu[n]$$

Where A, B are matrices to be identified by System Identification algorithms. The variable u[n] is the input vector, including the following candidate set point or variables.

1. Zone temperature set points: $T^s[n]=[T_1^s[n], T_2^s[n], \ldots, T_{Nz}^s[n]]^T$
2. Zone schedule, which is the number of occupancy for the zth zone at the nth time instance.

$$O[n]=[O_1[n],O_2[n],\ldots,O_z[n]]^T$$

3. RTU static pressure. The static pressure set point for the ith RTU is $P^{ssp}_i[n]$. Typical medium and large size buildings have more than one RTU, therefore the set point vector is $P^{ssp}[n]=[P^{ssp}_1[n],P^{ssp}_2[n],\ldots,P^{ssp}_{NRTU}[n]]^T$, where $N_{RTU}$ is the number of RTUs in the building.
4. RTU supply air temperature set point. Denote the supply air temperature set point for the i-th RTU is $T^{SAP}_1[n]$, then the supply air set point vector is: $T^{SAP}[n]=[T^{SAP}_1[n],T^{SAP}_2[n],\ldots,T^{SAP}_{NRTU}[n]]^T$,
5. $CO_2$ set point. The RTU outdoor air dampers are governed by return duct $CO_2$ level. For each building, we denote the CO2 set point as $P^{CO2}$.
6. Economizer set point. The outdoor temperature thresholds $T^E=[T^L, T^H]^T$.

$$u[n]=[T^S[n];O[n];P^{SSP}[n];T^{SAP}[n];P^{CO2};T^E].$$

Of course, the more input variables, the more complex the control algorithm. In order to simulate the whole battery life cycle in reasonable period of time, we need to evaluate each variable. For efficiency, the simulation may be limited to involve just enough variables having large impacts on the output.

When using EnergyPlus, the vector X[n] is implicit, (i.e., not fully observable). However, if the EnergyPlus model is fit with a linear regression model, then the X[n] will be explicit, (i.e., users do not need to specify X[n] in IDF file). If one state variable is useful, a user can define it as an output variable.

The zonal temperature set points are associated with the comfort level. Using an ASHRAE PMV model, a comfort function $C_m(T[n])$ may be established where room temperature is the input with the output being the percentage of occupants who feel comfort within the environment. It is assumed that the minimal comfort threshold is $T_{hm}$, then we have an inequality constraint:

$$T_{hm}-C_m(T[n])\le 0$$

where $T_z$ is a vector of multiple zones.

The outer loop optimization is responsible for lifecycle optimization, or finding an optimal configuration parameter θ. The generic case can be captured as a non-linear optimization problem.

$$\min J_2(\theta):=f_2(\theta)=\Sigma_{n=0}^N J_1[n]$$

subject to:

$$\min J_1[n]:=\Sigma_{i=0}^M f_1(X[n+i];\theta)$$

$$g_1(X[n];\theta)=0$$

$$g_2(X[n];\theta)\le 0$$

$$X[n+1]=g_3(X[n];\theta)$$

where N is the total number of sample across the whole battery lifecycle, up to 15 years.

According to further aspects of the present disclosure, an optimal combination of battery energy storage and leveraging intrinsic building thermodynamics along with HVAC systems is achieved in three steps. First, a life cycle assessment is performed. Second, a monthly peak load forecast is performed to identify a number of days (d) defining the peak load days of the month. Finally, an optimal hourly control strategy is developed, which is based in part on a probability that a given day falls within the top d peak load days of the month.

To reduce computation time, convex optimization processes may be used. An exemplary tariff model may be considered with reference to the table illustrated in FIG. 3. The first three rows indicate tariff or energy peak load prices for summer hours, where demand for electrical power to service air conditioning units throughout the hotter days of summer increases the demand response for the grid. First row 301 is a tariff applied to the months 6, 7, 8, and 9, corresponding to the summertime months of June, July, August and September, respectively. Moreover, the charge indicated in first row 301 applies to workdays of the week, denoted 2, 3, 4, 5, 6. This notation assigns integers to each day of the week with the week starting on Sunday (1). Thus, row one 301 applies to weekdays: Monday (2), Tuesday (3), Wednesday (4), Thursday (5), and Friday (6). Row one 301 indicates that power demanded Monday through Friday in June through September between the hours of 6 AM to 8 PM, incurs a tariff of $8.17. Similarly, row two 303 indicates that during the months of June through September power demanded Monday through Friday between 8 AM and 10 PM incurs a further tariff of $17.51. In addition to the above, power demanded at any time of day (e.g. 24 hours), 7 days a week between June and September, an additional tariff of 16.75 is incurred. Accordingly, as may be seen by the table of FIG. 3, peak load prices vary according to different time slots. Therefore, demand charges are based on time. By way of example, a peak occurring in the Summer on a Tuesday at 9:00 AM will incur a demand charge of:

$$\text{PowerPeak}*(8.17+17.51+16.75) \quad \text{Equation (6)}$$

Figures 5, 6:
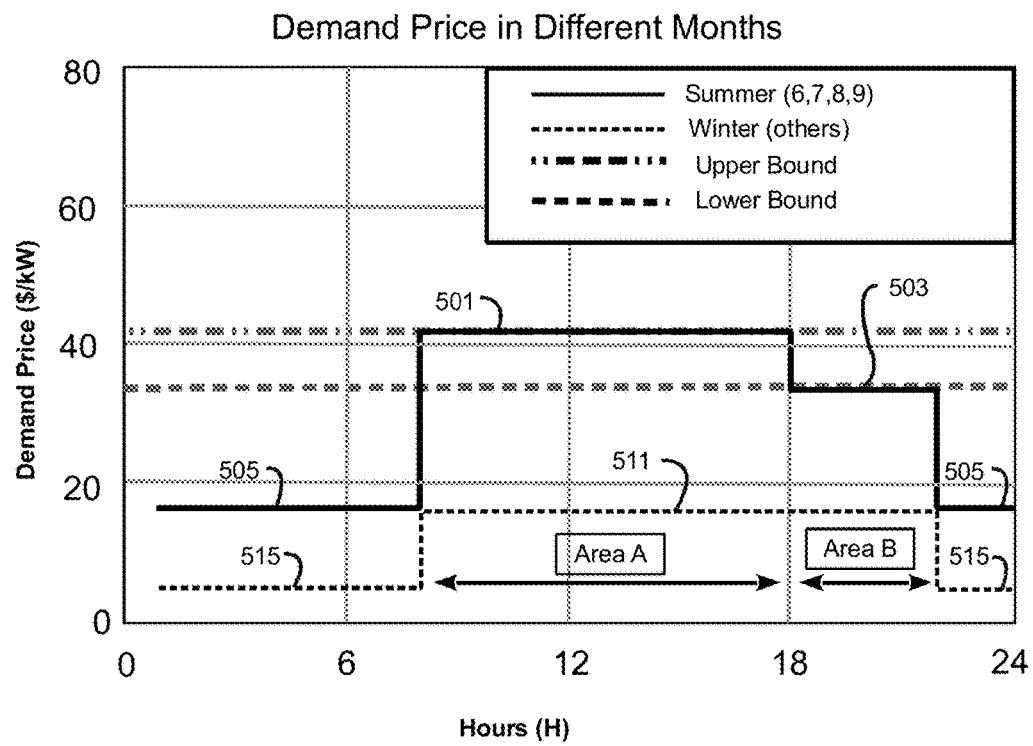
FIG. 5 is a graphical depiction of demand price versus hours of the day according to aspects an embodiment of this disclosure.
FIG. 6 is a table including recoupment costs for a battery system according to aspects of an embodiment of this disclosure.

The concept of demand prices according to time, and spanning different seasons, is shown graphically in FIG. 5. The horizontal axis represents the hours of the day from 00:00 (midnight) to 24:00 (the following midnight). Vertically, the total cost per kW in demand cost is shown. Summer months are shown in a solid line with a maximum region 501 occurring between the hours of 08:00 and 18:00. With reference to the table in FIG. 3, this maximum summer region 501 corresponds to the time slots indicated in the first three rows (301, 303, 305) which incur costs of 8.17, 17.51 and 16.75, respectfully. The sum of these costs yield a total cost per kW of $42.43 representative of the level of region 501. After 18:00 hours and up to 22:00 hours, the cost reflected in the first row 301 of FIG. 3 no longer applies but rows 2 and 3 are still in effect. The total cost per kW for the summer hours between 18:00 and 22:00 is then 16.75+17.51=34.26, which represents the level of region 503. Time regions 505 occurring after 22:00 hours and before 08:00 hours correspond to time slots that only apply charges as provided in the third row 305 of the table in FIG. 3 providing for a tariff of 16.75, reflected by the levels of regions 505. Accordingly, during summer hours there are two time slots in which extra tariff premiums are charged. The time period labeled "Area A" falls within peak business hours between 08:00 and 18:00, and tariffs during this period are stacked with the charges in row 1 through 3 of the table in FIG. 3 being combined to define the overall energy charge. The time period labeled "Area B" represents evening hours occurring after 18:00 and continuing through 20:00 and incurs the tariffs included in row 2 and row 3 of the table shown in FIG. 3. By identifying time slots associated with higher tariffs and energy costs, methods may be employed to shift energy usage to time slots in which the energy costs are lower. Energy shifting, when applied in cooperation with other factors, such as battery lifecycle costs and building thermal properties, may be used to devise a building energy management plant which leverages the capabilities of the building's systems along with available power sources, including both the grid and available energy storage solutions.

Figures 3, 4:
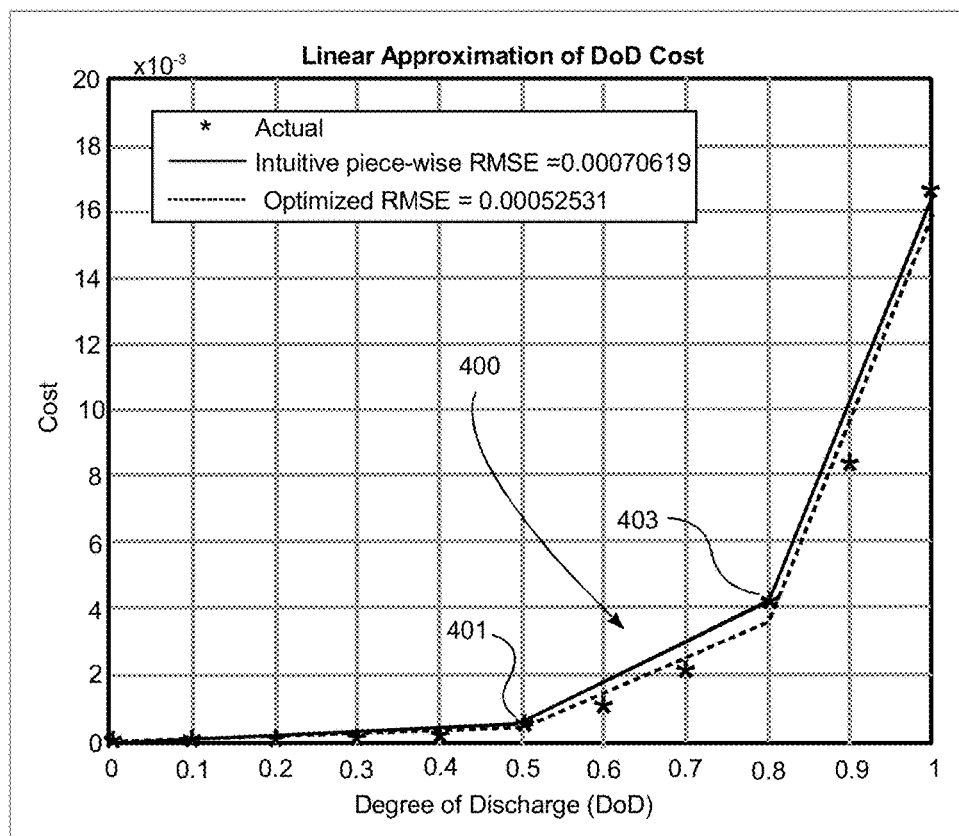
FIG. 3 is a table showing an exemplary tariff schedule.
FIG. 4 is a graphical depiction of cost versus degree of discharge (DoD) for a battery system according to aspects of embodiment of this disclosure.

In a like manner, for non-summer hours (e.g., months outside of June-September), region 511 represents the peak load tariff reflected in the table of FIG. 3 in the fourth row 307 at a cost of 11.34 and the fifth row 309 at a cost of 4.80, which added together result in a total cost per kW of 16.14. For time slots that fall outside the working hours of 08:00 to 20:00 hours, peaks falling within regions 515 only incur the non-Summer off-hours tariff of 4.80.

Battery cost may be approximated using a set of linear curves 400 as shown in FIG. 4. The solid line represents an intuitive curve that is fitted using a user's intuition. The dotted line represents an optimized fitted curve that is fit using a least mean squared error. The degree of discharge (DoD) incurs and increases costs 401 as the DoD surpasses 0.5, increasing costs at even greater rate 403 when surpassing 0.8. Accordingly, if the DoD can be maintained below a level of 0.5, significant costs from lifecycle costs relating to the battery may be avoided.

Since the costs for the DoD of the batteries may be approximated through a set of linear curves, the problem of lifecycle costs may be converted to a mixed integer nonlinear programming problem according to the following. The problem may be considered in one of two ways. In a first approach, non-convex constraints are used. The non-convex constraint method may be slow, but the results may be more accurate. Conversely, a second approach uses convex constraints. This approach is faster but may be less accurate. The convex approach returns a boundary for an optimized result, but this approach does not predict the exact value of the optimized result. The decision of which approach to use may depend of various factors including, available computational resources, available solvers, and the complexity of the problem. In the descriptions that follow, the convex approach is used unless expressly stated otherwise. The non-convex approach is characterized by:

$$\min_{x_1,x_2,x_3,P}(C_1 x_1 \max(P(1:8) + PF(1:8)) +$$
$$C_2 x_2 \max(P(9:16) + PF(9:16)) + C_3 x_3 \max(P(17:24) + PF(17:24))$$

where $C_1$, $C_2$, $C_3$ are positive constants and $x_1, x_2, x_3$ are binary; the power of the current day is P; $P \in R^{24}$, the peak power of days in the current billing period is PF; $PF \in R^{24}$, subject to:

$$\underline{P} \leq P \leq \overline{P}$$

$$\underline{E} \leq C_4 + MP \leq \overline{E}$$

Where P and $\overline{P}$ are the lower bound and upper bound power of the day, as shown in FIG. 5; E and $\overline{E}$ are the minimal and maximal energy consumption of the day; M is a lower unitary triangular matrix of size $R^{24 \times 24}$ sum(P)=0

$x_1(\max(P(1:8)+PF(1:8))-\max(P(9:16)+PF(9:16)) \geq 0$ $x_1(\max(P(1:8)+PF(1:8))-\max(P(17:24))+PF(17:24))) \geq 0$ $x_2(\max(P(9:16)+PF(9:16))-\max(P(1:8)+PF(1:8)) \geq 0$ $x_2(\max(P(9:16)+PF(9:16))-\max(P(17:24))+PF(17:24))) \geq 0$ $x_3(\max(P(17:24)+PF(17:24))-\max(P(1:8)+PF(1:8)) \geq 0$ $x_3(\max(P(17:24)+PF(17:24))-\max(P(9:16))+PF(9:16))) \geq 0$ x1+x2+x3=1

The upper bound and lower bound for a Convex form approach may be characterized by:

Upper Bound $$\min_{x_1,x_2,x_3,P}(C_1 x_1 \max(P(1:8) + PF(1:8)) +$$
$$C_2 x_2 \max(P(9:16) + PF(9:16)) +$$
$$C_3 x_3 \max(P(17:24) + PF(17:24))$$

$P = \overline{P}$ $C_4 + MP = \overline{E}$ $x1 + x2 + x3 = 1$ $x_i \geq 0$

Lower Bound $$\min_{x_1,x_2,x_3,P}(C_1 x_1 \max(P(1:8) + PF(1:8)) +$$
$$C_2 x_2 \max(P(9:16) + PF(9:16)) +$$
$$C_3 x_3 \max(P(17:24) + PF(17:24))$$

$P = \underline{P}$ $C_4 + MP = \underline{E}$ $x1 + x2 + x3 = 1$ $x_i \geq 0$

The cost and payback (e.g., recoupment of investment dollars) of a battery only system for several types of buildings is shown in the table of FIG. 6. The figures provided in FIG. 6 were generated in an EnergyPlus simulation based on U.S. Department of Energy benchmark buildings. For a large office building 601, having a battery size of 10 kWh and an inverter size of 10 kWh, the Upper bound for peak demand in Summer is 2144 kW and 317 kW in Winter and a Lower Bound of 1874 kW in Summer and 243 kW in Winter. The time required to achieve a return on investment which pays for the battery storage solution is in a range between about 1.4 years to about 1.6 years based on accrued energy savings. For a medium office building 603, having a battery size of 5 kWh and an inverter size of 5 kWh, the Upper bound for peak demand in Summer is 939 kW and 118 kW in Winter and a Lower Bound of 828 kW in Summer and 78 kW in Winter, the time required to achieve a return on investment which pays for the battery storage solution is in a range between about 1.6 years to about 1.8 years. This longer time period is due to the smaller amount of energy savings commensurate with the smaller amount of demand. For a small office building 605, having a battery size of 1 kWh and an inverter size of 1 kWh, the Upper bound for peak demand in summer is 104 kW and 12 kW in Winter and a Lower Bound of 95 kW in Summer and 12 kW in Winter. The time required to achieve a return on investment which pays for the battery storage solution is extended to a range between about 2.9 years to about 3.2 years.

After optimization of lifecycle costs, the second step is to forecast the monthly peak load. For example, to forecast the top five peak load days of the month. The forecast described herein may be used to forecast a different number of top peak load days. The specific implementation described herein using five peak load days is provided merely by way of example and is not limiting in any way. In the non-limiting embodiment described herein, the use of five peak load days as a forecast threshold is particularly interesting and useful when considering energy costs and demand in the metropolitan New York City area. This is because historical weather data indicates that the top five peak load days have the most significant impact on the overall energy bill. However, these parameters may vary in other areas and with different utility providers.

Figure 7:
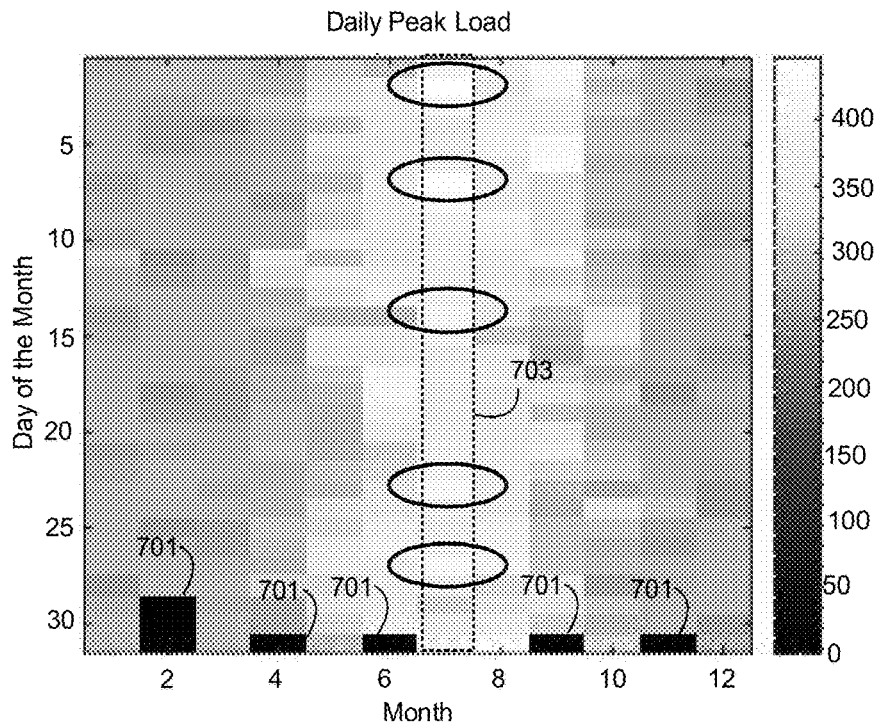
FIG. 7 is a graphical depiction of an exemplary annual peak usage per day and month throughout the year according to aspects of this embodiment.

Referring now to FIG. 7 in combination with FIG. 8A-8D, FIG. 7 is a graphical depiction showing daily peak load for each day of each month of the year. Each day is represented by a rectangular segment with the intensity of each rectangular segment indicating the level of demand. Segments shown as black 701 are placeholders for days in months which do not have 31 days. As seen in FIG. 7, generally higher peak loads occur during the summer months between May and September where the daily segments indicate a generally higher peak load than the remaining months of the year.

Figure 8A:
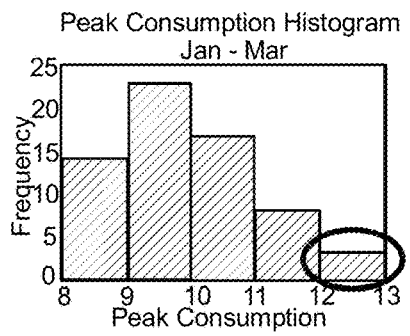
FIG. 8A is a histogram indicating the number of days that reach given level of demand for the months of January, February and March according to aspects of an embodiment of this disclosure.
Figure 8B:
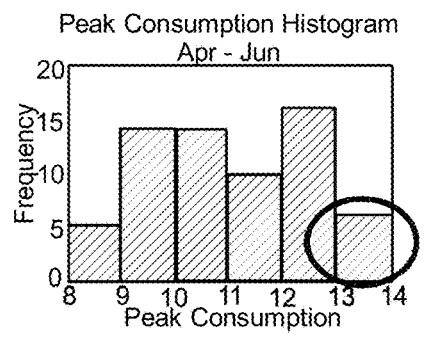
FIG. 8B is a histogram indicating the number of days that reach given level of demand for the months of April, May and June according to aspects of an embodiment of this disclosure.
Figure 8C:
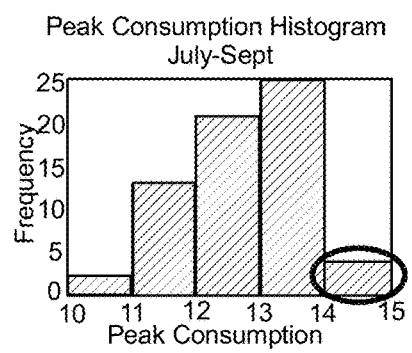
FIG. 8C is a histogram indicating the number of days that reach given level of demand for the months of July, August, and September according to aspects of an embodiment of this disclosure.
Figure 8D:
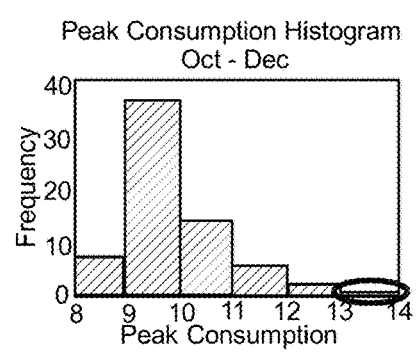
FIG. 8D is a histogram indicating the number of days that reach given level of demand for the months of October, November, and December according to aspects of an embodiment of this disclosure.

FIG. 8A is a histogram showing the number of days that reach a given peak demand level for the months of January, February and March. FIG. 8B is a histogram showing the number of days that reach a given peak demand level for the months of April, May and June. FIG. 8C is a histogram showing the number of days that reach a given peak demand level for the months of July, August and September. While FIG. 8D is a histogram showing the number of days that reach a given peak demand level for the months of October, November and December. As indicated by the circled regions of each histogram, in each three-month quarter the peak consumption level typically occurs about 5 times. As shown in FIG. 7, a large building usually has around 5 peak days in the column 703 representing July, 4 peak days in June, etc.

At run-time, a short-term weather forecast is available. For example, each morning, a peak load for that day may be forecasted based on the day's weather forecast. If historical weather data and historical peak load data is considered, the day's forecasted peak load may be utilized in combination with the historical data to provide a daily peak forecast. Based on a long-term weather forecast, there may be additional peaks forecasted. With reference to the pseudo-code below, a peak forecast method based on an artificial neural network is presented. The input may be either a long-term or short-term weather forecast, and the output is the expected peak load of the day.

TABLE 1

Daily peak forecast with short-term weather forecast

1 Inputs: $x_1$: training weather, $x_2$: test weather
2     $y_1$: training load profile, $y_2$: test load profile, k, number of nearest neighbor
3     Ratio of number of sample $x_1$:$x_2$
4 Outputs: $\tilde{y}_2$: predicted load profile
5 Randomly select training and test dates
6 for each $x_j$ in $x_2$
7     for each $x_i$ in $x_1$
8         dist(i, j) ← $\|x_i - x_j\|$
9     end
10     idx(l) ← i, where dist(i,j) is the $l^{th}$ smallest element
11     for each $l \in [1, 2, \ldots, k]$ do
12 
$$w(l) = \frac{\text{dist}(\text{idx}(k+1), j) - \text{dist}(\text{idx}(l), k)}{\text{dist}(\text{idx}(k+1), j) - \text{dist}(\text{idx}(1), k)}$$

13     end
14 
$$\tilde{y}_2^j = \frac{1}{\sum_{l=1}^{k} w(l)} \sum_{l=1}^{k} w(l) y_1^j$$

15 end

Figure 9:
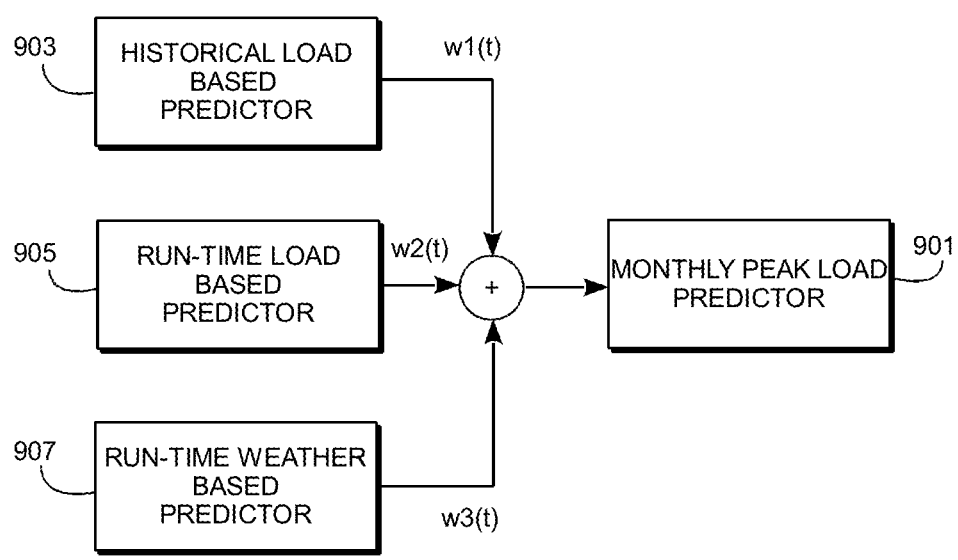
FIG. 9 is a block diagram of a weighted system for producing a monthly peak load prediction according to an aspect of an embodiment of this disclosure.

Different information sources may be fused to provide an accurate monthly peak load forecast. As shown in the block diagram of FIG. 9, different daily peak predictions 901 may be fused using a weighted method. For example, Weighted Least Squares (WLS) or Recursive Weighted Least Squares (RWLS) filters may be employed. In Equation (7) below, three sources of information are considered to produce the peak load forecast.

$$\hat{P}[k+1] = w^T[k]P[k] \quad \text{Equation (7)}$$

$$w^T[k] = [w_1[k], w_2[k], w_3[k]]$$

$$P[k] = \begin{bmatrix} p_1[k] \\ p_2[k] \\ p_3[k] \end{bmatrix},$$

where weights $w_1$, $w_2$ and $w_3$, as shown in FIG. 9 are applied to respectively: historical load predictor 903, run-time load predictor 905, and run-time weather based predictor 907, and where $p_1[k]$, $p+2+[k]$, $p_3[k]$ are the daily peak forecasts based on different weather forecasts, k is the number of the day within the month. At the end of each day, the peak of the day is known a posteriori, which is denoted as P[k+1]. The WLS or RWLS method may update the weights w[k] in order to minimize the forecast error for the next iteration.

$$w[k+1] = \text{argmin}(\|\hat{P}[k+1] - P[k+1]\|) \quad \text{Equation (8)}$$
$$= (\|w^T[k]P[k] - P[k+1]\|)$$

Figure 10A:
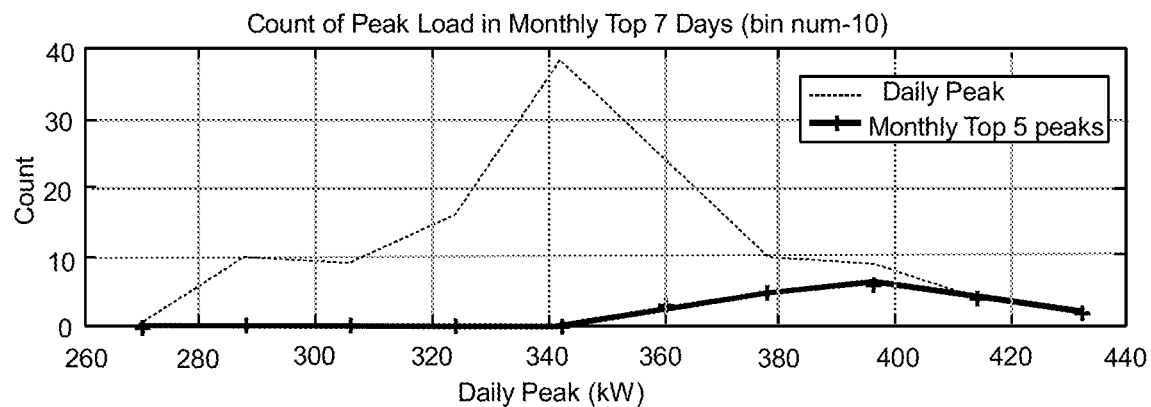
FIG. 10A is a graphical depiction of a count of peak load in monthly top 7 days according to aspects of an embodiment of this disclosure.
Figure 10B:
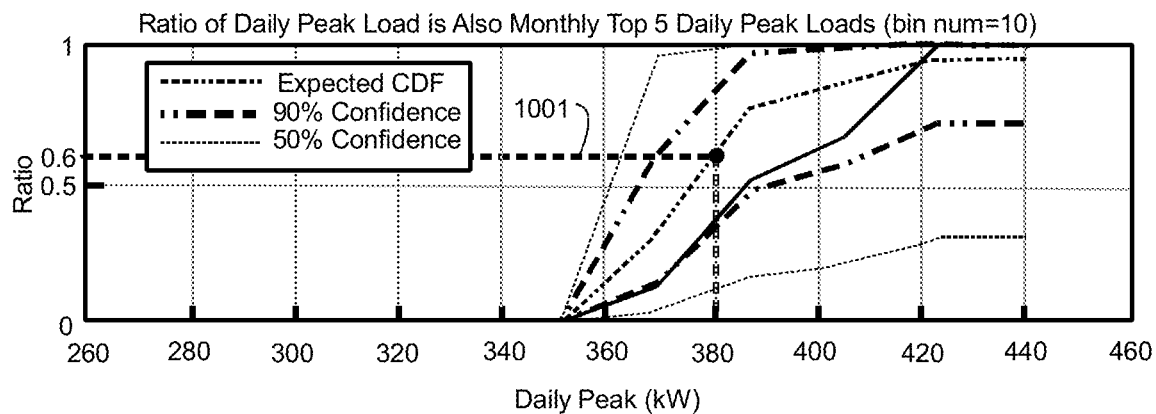
FIG. 10B is a graph of the ratio of daily peak load also being a monthly top 5 peak load according to aspects of an embodiment of this disclosure.
Figure 10C:
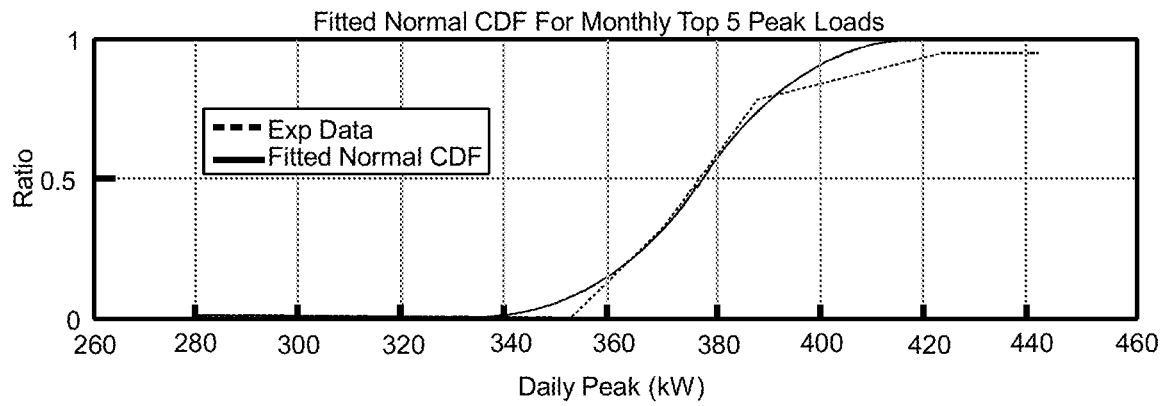
FIG. 10C is a graph showing a fitted CDF curve according to aspects of an embodiment of this disclosure.

Once the daily peak forecast is determined, the threshold of monthly peak days based on a cumulative density function (CDF) may be predicted as shown in the graph of FIG. 10A. Based on historical data, the CDF curve may be fit as shown in the graph of FIG. 10C. In FIG. 10B, the horizontal axis represents the daily peak load in kW, and the vertical axis represents the probability that the particular day will fall within the top five peak load days in the month. For example, with reference to FIG. 10B, a peak load of 380 kW for a given day will have a 60 percent chance 1001 of having that day's peak load being among the top five peak load days for the month.

In a final step of the optimization, an optimization of battery utilization in combination with HVAC control produces an hourly energy building control strategy based at least in part of the monthly top peak days described above. The formulation of the hourly strategy is shown below.

The stochastic programming may be formulated as follows:

$$\min p^d \max\{L_h, L_t + p_{bat}^t, \mathbb{E}(L_f(\xi) + P_{bat}^f(\xi)\} + \text{Deg}(P_{bat}^t) + \mathbb{E}\text{Deg}(P_{bat}^f(\xi) + \text{EnCost}(P_{bat}^t)]$$

where $P_{bat}^t$ is the power control of the battery for the current day, and $P_{bat}^f$ is the battery power control for a future time; $L_h$ represents the historical peak load, where $L_t$ is the load for the current day; and
$L_f(\xi)$ is the future load with uncertainty $\xi$, $p^d$ is the demand charge and where
Deg(•) is the battery degradation cost convex, and EnCost(•) is the energy cost which is also convex.

The control seeks to minimize the expected value of the demand charge, energy charge, and battery degradation. In order to make this more tractable, Sample Average Approximation may be used as follows:

Generate N scenarios based on the distribution of the today's forecasted peak load. The stochastic programming then becomes:

$$\min p^d \max\left\{L_h, L_t + P_{bat}^t, \frac{1}{N}\sum_{i=1}^{N}\left(L_{f,s} + P_{bat}^{f,s}\right)\right\} + \text{Deg}(P_{bat}^{f,s})] + \text{Deg}(P_{bat}^t) + \text{EnCost}(P_{bat}^t)]$$

$$\text{s.t } P_{bat}^t, P_{bat}^{f,s} \in C$$

This disclosure has presented 3 methodologies or steps for optimization of a battery-grid type of power management system. Methodology 1 assesses savings under ideal conditions and specifies an optimum energy storage solution configuration. Methodology 2 and Methodology 3 provide an assessment for energy bill savings under realistic scenarios. Methodology 2 is focused on forecasting some number of peak days of the month. Methodology 3 is a stochastic model predictive control method for daily run time control strategy optimization. For DOE large benchmark buildings, the expected annual savings in the New York City area (with battery only condition) is $1874 to $2144 per year, and the savings under realistic weather conditions is $1487 to $1737 per year, or 77% of the ideal case. Additionally, the ideal case savings for battery and HVAC integrated control is $7989 to $9962 per year.

Figure 11:
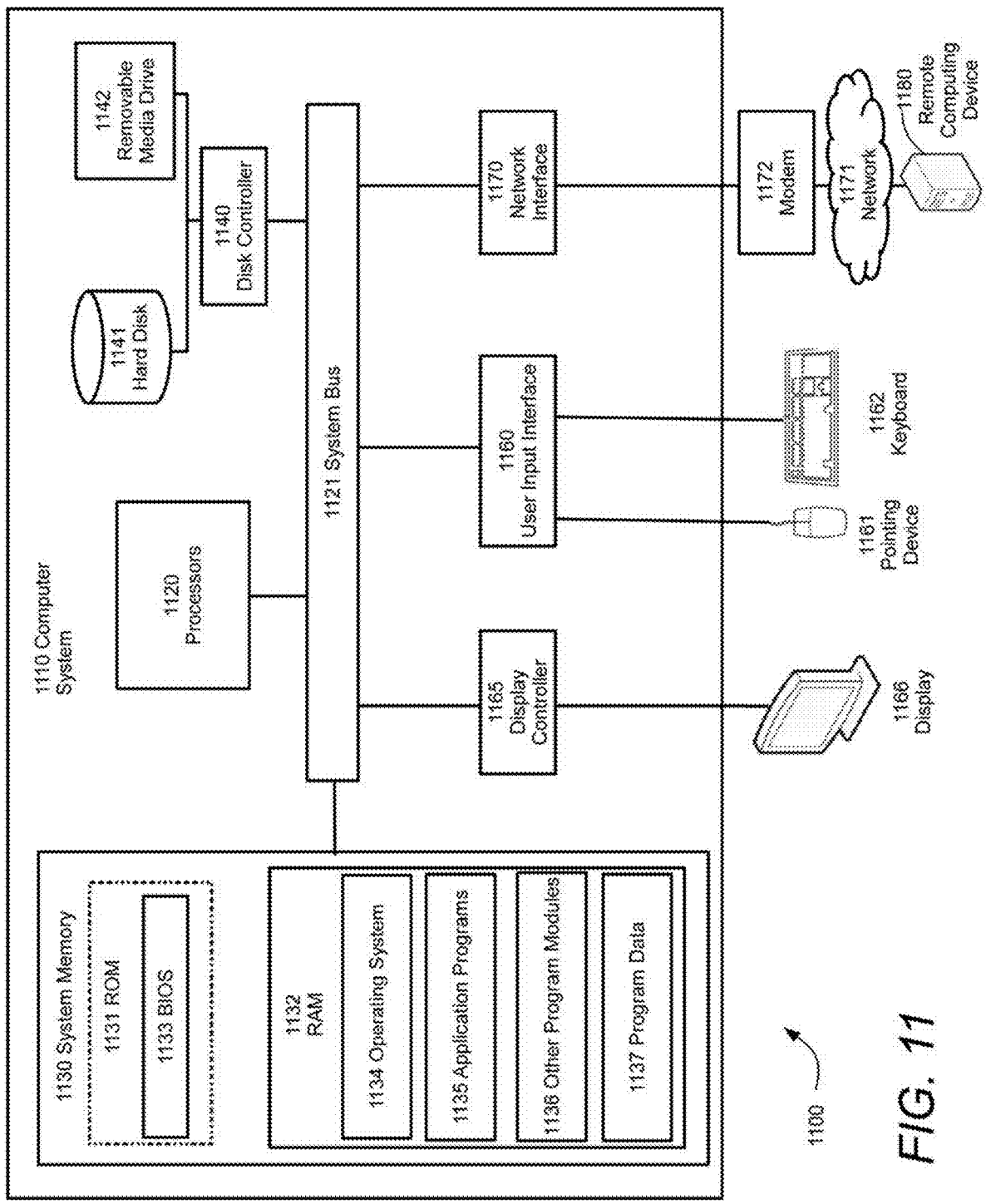
FIG. 11 is a block diagram of a lifecycle optimization system for a building battery-based energy system.

FIG. 11 illustrates an exemplary computing environment 1100 within which embodiments of the invention may be implemented. Computers and computing environments, such as computer system 1110 and computing environment 1300, are known to those of skill in the art and thus are described briefly here.

As shown in FIG. 11, the computer system 1110 may include a communication mechanism such as a system bus 1121 or other communication mechanism for communicating information within the computer system 1110. The computer system 1110 further includes one or more processors 1120 coupled with the system bus 1121 for processing the information.

The processors 1120 may include one or more central processing units (CPUs), graphical processing units (GPUs), or any other processor known in the art. More generally, a processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

Continuing with reference to FIG. 11, the computer system 1110 also includes a system memory 1130 coupled to the system bus 1121 for storing information and instructions to be executed by processors 1120. The system memory 1130 may include computer readable storage media in the form of volatile and/or nonvolatile memory, such as read only memory (ROM) 1131 and/or random access memory (RAM) 1132. The RAM 1132 may include other dynamic storage device(s) (e.g., dynamic RAM, static RAM, and synchronous DRAM). The ROM 1131 may include other static storage device(s) (e.g., programmable ROM, erasable PROM, and electrically erasable PROM). In addition, the system memory 1130 may be used for storing temporary variables or other intermediate information during the execution of instructions by the processors 1120. A basic input/output system 1133 (BIOS) containing the basic routines that help to transfer information between elements within computer system 1110, such as during start-up, may be stored in the ROM 1131. RAM 1132 may contain data and/or program modules that are immediately accessible to and/or presently being operated on by the processors 1120. System memory 1130 may additionally include, for example, operating system 1134, application programs 1135, other program modules 1136 and program data 1137.

The computer system 1110 also includes a disk controller 1140 coupled to the system bus 1121 to control one or more storage devices for storing information and instructions, such as a magnetic hard disk 1141 and a removable media drive 1142 (e.g., floppy disk drive, compact disc drive, tape drive, and/or solid state drive). Storage devices may be added to the computer system 1110 using an appropriate device interface (e.g., a small computer system interface (SCSI), integrated device electronics (IDE), Universal Serial Bus (USB), or FireWire).

The computer system 1110 may also include a display controller 1165 coupled to the system bus 1121 to control a display or monitor 1166, such as a cathode ray tube (CRT) or liquid crystal display (LCD), for displaying information to a computer user. The computer system includes an input interface 1160 and one or more input devices, such as a keyboard 1162 and a pointing device 1161, for interacting with a computer user and providing information to the processors 1120. The pointing device 1161, for example, may be a mouse, a light pen, a trackball, or a pointing stick for communicating direction information and command selections to the processors 1120 and for controlling cursor movement on the display 1166. The display 1166 may provide a touch screen interface which allows input to supplement or replace the communication of direction information and command selections by the pointing device 1161.

The computer system 1110 may perform a portion or all of the processing steps of embodiments of the invention in response to the processors 1120 executing one or more sequences of one or more instructions contained in a memory, such as the system memory 1130. Such instructions may be read into the system memory 1130 from another computer readable medium, such as a magnetic hard disk 1141 or a removable media drive 1142. The magnetic hard disk 1141 may contain one or more data stores and data files used by embodiments of the present invention. Data store contents and data files may be encrypted to improve security. The processors 1120 may also be employed in a multi-processing arrangement to execute the one or more sequences of instructions contained in system memory 1130. In alternative embodiments, hard-wired circuitry may be used in place of or in combination with software instructions. Thus, embodiments are not limited to any specific combination of hardware circuitry and software.

As stated above, the computer system 1110 may include at least one computer readable medium or memory for holding instructions programmed according to embodiments of the invention and for containing data structures, tables, records, or other data described herein. The term "computer readable medium" as used herein refers to any medium that participates in providing instructions to the processors 1120 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 1141 or removable media drive 1142. Non-limiting examples of volatile media include dynamic memory, such as system memory 1130. Non-limiting examples of transmission media include coaxial cables, copper wire, and fiber optics, including the wires that make up the system bus 1121. Transmission media may also take the form of acoustic or light waves, such as those generated during radio wave and infrared data communications.

The computing environment 1100 may further include the computer system 1110 operating in a networked environment using logical connections to one or more remote computers, such as remote computing device 1180. Remote computing device 1180 may be a personal computer (laptop or desktop), a mobile device, a server, a router, a network PC, a peer device or other common network node, and typically includes many or all of the elements described above relative to computer system 1110. When used in a networking environment, computer system 1110 may include modem 1172 for establishing communications over a network 1171, such as the Internet. Modem 1172 may be connected to system bus 1121 via user network interface 1170, or via another appropriate mechanism.

Network 1171 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 1110 and other computers (e.g., remote computing device 1180). The network 1171 may be wired, wireless or a combination thereof. Wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 1171.

In aspects of the present invention, the computer system 1100 includes computer executable instructions stored memory, such as hard disk 1141 or removable media drive 1142. In combination with processors 1120 implemented as battery lifecycle optimization processors, computer system 1100 becomes a battery lifecycle optimization system directed to solving the technical problem of optimizing a hourly energy control strategy for a building, based on energy costs and tariffs, monthly predicted peak demand, battery configuration, and building thermodynamics. Systems according to aspects of the invention may communicate with building automation systems providing optimized hourly control commands which may be executed by various controllers within the building systems for example, via programmable logic controllers (PLCs).

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

What is claimed is:

1. A system for calculating lifecycle costs for an electric battery based energy storage (ES) system comprising:
    an electric battery lifecycle optimizer configured to receive a plurality of battery models, each battery model configured, when used by the battery lifecycle optimizer, to simulate one of a plurality of battery configurations;
    a peak power demand forecaster, configured to identify a number, n, of top peak demands within a time period spanning about one month; and
    a building energy system controller configured to perform a simulation of a building energy plan, the building energy plan comprising an hourly energy management plan for utilizing at least one of an electric battery energy storage system, a building heat, ventilation, and air conditioning (HVAC) system, and a building thermal properties profile;
    wherein the building energy system controller is configured to identify an optimal hourly energy program, the optimal hourly energy plan representative of a minimized energy cost for the building.

2. The system of claim 1, wherein the building energy controller is configured to receive a building thermal properties profile representative of thermodynamic characteristics of the building.

3. The system of claim 2, wherein the building energy controller is further configured to receive at least one of a plurality of tariff schedules representative of time variant energy costs for a given energy provider.

4. The system of claim 1, wherein the building energy controller is further configured to receive at least one of a plurality of tariff schedules representative of time variant energy costs for a given energy provider.

5. The system of claim 1, wherein the building energy controller is configured to output the optimal hourly energy program in a format receivable by at least one of a building automation system (BAS) and a building management system (BMS).

6. The system of claim 1, wherein the building energy controller is configured as a model predictive control (MPC).

7. The system of claim 6, wherein the MPC is configured to run an electric battery lifecycle simulation based on a plurality of static configuration parameters.

8. The system of claim 7, wherein the plurality of static configuration parameters includes at least one of:
    battery capacity;
    inverter size;
    threshold values to trigger battery charging or discharging; and
    a vector containing internal states of a building or a battery.

9. The system of claim 8, wherein the vector containing internal states of the building or electric battery includes at least one of:
    building zone temperature measurements;
    building zone humidity measurements;
    remote terminal unit (RTU) static pressure values;
    supply air temperature values;
    return duct $CO_2$ level values;
    outdoor temperature values; and
    outdoor relative humidity values.

10. A method for optimizing lifecycle costs of an electric battery based energy storage (ES) system comprising:
    in an electric battery lifecycle optimization processor, calculating an optimal battery configuration including an optimized size for the battery, the battery configured to provide supplemental power to a building, the building connected to a power grid;
    in the electric battery lifecycle optimization processor, calculating a monthly peak power requirement for the building; and
    calculating an hourly energy management plan based on the monthly peak power requirement and the optimized electric battery configuration,
    wherein calculating the optimal battery configuration comprises receiving at least one of a plurality of battery models, each battery model including information representative of a battery size, capacity, and costs related to the battery's degree of discharge.

11. The method of claim 10, wherein calculating a monthly peak power requirement for the building comprises forecasting a number, n, of the highest peak power demand days within a given month.

12. The method of claim 11, wherein the number of highest peak power demand days is five.

13. The method of claim 10, wherein calculating the optimal electric battery configuration comprises minimizing a combined factor representative of battery degradation cost relating to the state of health of the battery, energy cost, and demand power cost with respect to a vector of the operating power of the battery.

14. The method of claim 13, wherein calculating the optimal electric battery configuration is achieved using a convex optimization technique.

15. The method of claim 10, wherein calculating the monthly peak power requirement comprises:
    receiving a short-term weather forecast and historical weather data;
    receiving historical peak load information for the building;
    inputting the short-term weather forecast, historical weather data and historical peak load information to an artificial neural network configured to produce a predicted load profile.

16. The method of claim 15, wherein calculating the monthly power requirement further comprises:
    fusing data sources using a weighted calculation.

17. The method of claim 16, wherein the weighted calculation is one of a weighted least squares (WLS) calculation, and a Recursive Weighted Least Squares (RWLS) calculation.

18. The method of claim 16, wherein the data sources comprise:
    a historical load predictor output;
    a run-time load predictor output; and
    a run-time weather predictor output.

* * * * *